United States Patent [19]
Kerber et al.

[11] Patent Number: 5,882,963
[45] Date of Patent: Mar. 16, 1999

[54] METHOD OF MANUFACTURING SEMICONDUCTOR COMPONENTS

[75] Inventors: Martin Kerber; Helmut Klose, both of Munich, Germany; Andreas Vom Felde, Wappingers Fall, N.Y.

[73] Assignee: Siemens Aktiengesellschaft, Munich, Germany

[21] Appl. No.: 910,055

[22] Filed: Aug. 12, 1997

Related U.S. Application Data

[63] Continuation of Ser. No. 561,821, Nov. 22, 1995, abandoned.

[30] Foreign Application Priority Data

Nov. 24, 1994 [DE] Germany .................... 44 41 898.1

[51] Int. Cl.$^6$ .................................................. H01L 21/44
[52] U.S. Cl. ..................... 438/195; 438/619; 438/622; 438/631
[58] Field of Search .................... 438/619, 623, 438/622, 624, 631, 195

[56] References Cited

U.S. PATENT DOCUMENTS

| 4,987,101 | 1/1991 | Kaanta et al. | 437/228 |
| 5,413,962 | 5/1995 | Lur et al. | 437/195 |
| 5,559,055 | 9/1996 | Chang et al. | 438/586 |

FOREIGN PATENT DOCUMENTS

| 0393635 | 10/1990 | European Pat. Off. . |
| 0501407 | 9/1992 | European Pat. Off. . |
| 0603104 | 6/1994 | European Pat. Off. . |
| 2247986 | 3/1992 | United Kingdom . |

Primary Examiner—Caridad Everhart
Attorney, Agent, or Firm—Hill & Simpson

[57] ABSTRACT

A method of manufacturing a semiconductor component, wherein capacitances occurring between contacts, interconnects or metallizations are reduced by filling cavities with air or gas is provided. The cavities are produced between the semiconductor material and a passivation layer in a region wherein the interconnects are surrounded by dielectric and are subsequently closed by a further passivation layer.

7 Claims, 1 Drawing Sheet

METHOD OF MANUFACTURING SEMICONDUCTOR COMPONENTS

This is a continuation, of application Ser. No. 561,821 filed Nov. 22, 1995, now abandoned.

BACKGROUND OF THE INVENTION

1. Field of the Invention

The present invention is directed generally to semiconductors and more specifically to a method of manufacturing semiconductor components having interspaces filled with a gas to reduce capacitance of interconnects.

2. Description of the Related Art

The capacitance of interconnects is one of the limiting factors for the switching speed of integrated circuits on semiconductor chips. With smaller lateral dimensions, the spacings between the various interconnects also become smaller, so that the coupling capacitances between neighboring interconnects increase to the same extent. The capacitances between various metallization levels also play a part given higher integration density. Over and above this, the average interconnect length to be driven by a gate also increases, particularly in logic circuits with increasing integration density, so that either more powerful driver stages and/or a reduction of the supply voltage are required. Oxide that is applied by low-temperature CVD (Chemical Vapor Deposition) is usually utilized as intermetal dielectric (IMOX) in integrated circuits on silicon wafers.

GB Patent 22 47 986, EP 603 104 A1, EP 501 407 A1 and EP 393 635 disclose semiconductor components wherein interspaces that are filled with air or a gas are present between interconnects or metallizations to reduce the capacitances occurring between the interconnects. These interspaces are fashioned as trenches, cavities or honeycomb-like cells.

SUMMARY OF THE INVENTION

An object of the present invention is to provide a simplified method for the manufacture of a semiconductor component with metallizations, contacts or interconnects, whereby interspaces filled with air or with a gas are provided to reduce the capacitances that occur between these conductors.

This object is achieved with a method of manufacturing a semiconductor component having electrically conductive contacts and/or interconnects that are separated from one another in regions by dielectric and are surrounded in regions by cavities that are filled with gas and closed off from the outside, comprising the following steps: applying the contacts and/or interconnects to a side of the semiconductor component electrically insulated from one another by dielectric; covering the side of the component having the contacts and/or interconnects with a passivation layer such that the dielectric can be selectively removed; producing openings in the passivation layer, wherein said openings are large enough and numerous enough for a subsequent etching of the dielectric and small enough for a subsequent deposition of a further passivation layer such that the further passivation layer does not fill the cavities; etching off the dielectric around the contacts and/or interconnects in regions through the openings, wherein the etching occurring selectively with respect to the contacts and/or interconnects and with respect to the passivation layer to produce the cavities; and closing the openings by deposition of a further passivation layer without filling the cavities.

Capacitance is proportional to the dielectric constant of the material between the electrodes. A slight capacitance between interconnects is achieved when the interspace between the interconnects is filled with a material having an optimally low dielectric constant. In the inventively manufactured component, cavities wherein the intermetal dielectric is replaced by air or by an immersion gas are present in regions between the interconnects. The capacitance is therefore significantly reduced in the region of the cavities. Adequate electrical insulation is also assured given a long-term load. The interconnects retain an adequate mechanical stability due to the remaining dielectric separating the cavities from one another. The dielectric is present in its full height in the region of the metallization layers, i.e. enclosing or carrying all metallizations that are present above one another. The inventive manufacture of the component can be simply implemented and within the framework of the standard manufacturing process because air or the specific immersion gas are compatible with semiconductor technology.

The inventive method is described below with reference to the drawings that show a semiconductor component in crossection after the performance of various steps of the method.

DETAILED DESCRIPTION OF THE PREFERRED EMBODIMENTS

Figure 1:
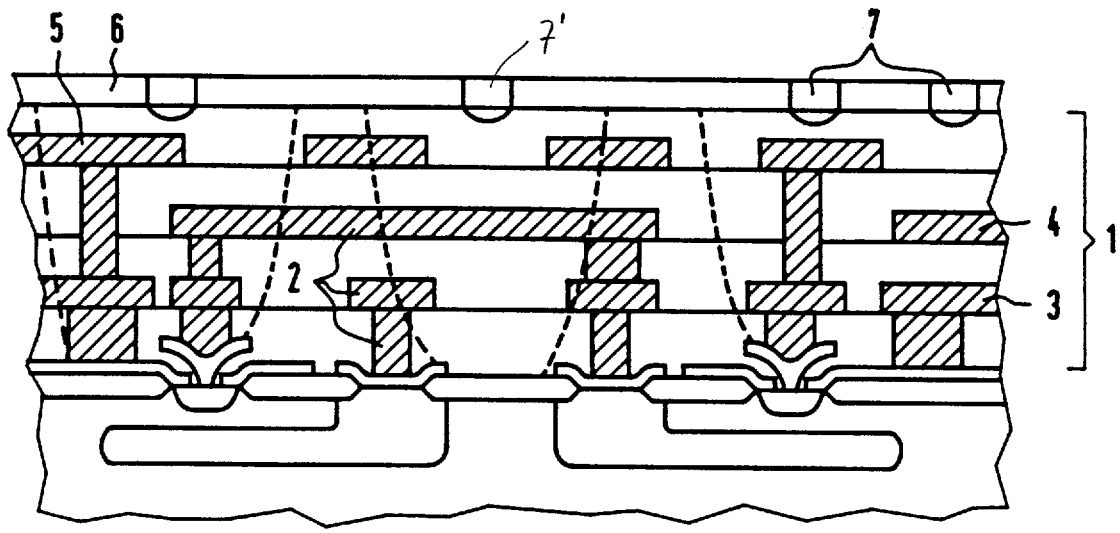
FIG. 1 is a cross sectional view of a semiconductor component manufactured in accordance with the method of the present invention.

FIG. 1 shows a plurality of contacts, metallizations and interconnects 2 (shown shaded) in a region 1 on the upper side of a semiconductor component. The plurality are insulated from one another by a dielectric. For example, two bipolar transistors are located on the upper side of a substrate. The transistors are interconnected to one another and to further components. Various contacts are therefore located on various regions of the semiconductor material in the described exemplary embodiment. A structured, first metallization level 3 is applied onto the contacts. Further metallization levels 4,5 that respectively comprise vertical connections of metal are located thereabove. The interconnects and conductive connections in this metal structure are electrically insulated from one another by dielectric into which the metallizations are embedded. A passivation layer 6 is applied on the upper side of the region 1. The passivation layer 6 is preferably planarized with the dielectric. The passivation layer 6 can also preferably be formed of silicon nitride. For reducing the interconnect capacitance, the dielectric in the region 1 is then removed region-by-region by a spatially limited isotropic etching, whereby the interspaces between the interconnects are filled with air or immersion gas. To this end, openings 7 are etched into the passivation layer 6. The openings 7 are provided in such a number and size that the etching of the dielectric present therebelow can subsequently occur and the openings 7 can be subsequently closed with a further passivation without the etched-out cavities being filled again. The openings 7 are preferably arranged in the region of the metallizations. As in the case of a middle opening 7' in FIG. 1, it can be advantageous to arrange the opening 7' over a region wherein it is especially important to reduce the capacitances between the interconnects, even if no components are integrated there. The etching of the cavities under the openings 7 occurs isotropically selectively to the interconnects and to the passivation layer 6. The material of the passivation layer 6 is to be correspondingly selected, so that the material of the passivation layer 6 is attacked as little as possible when etching the dielectric. The etching can occur, for example, with HF gas or the addition of $HNO_3$ when, for example, $SiO_2$ is used for region 1 and nitride is used for the passivation layer 6. In order to improve the selective etchability of the dielectric relative to the interconnects, it can be advantageous for the interconnects to be made of tungsten.

Figure 2:
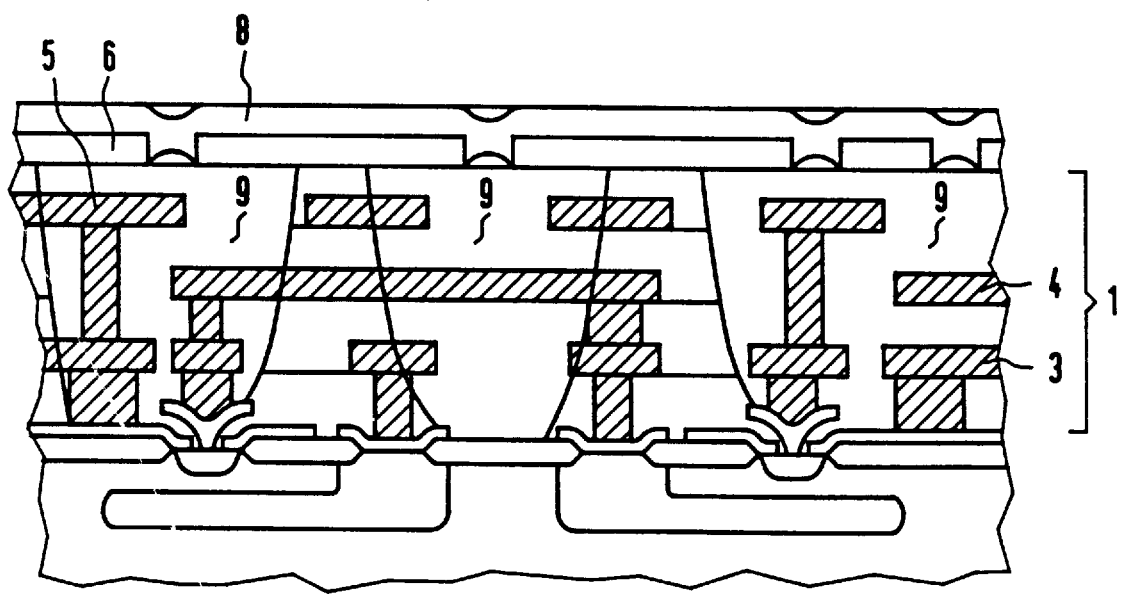
FIG. 2 is a cross sectional view of a semiconductor component manufactured in accordance with the method of the present invention.

Cavities in the regions bounded by broken lines in FIG. 1 are produced in this way between the interconnects and contacts. A temporal limitation of the etching attack assures that the spatial dimensions of these cavities do not become too large. As a result, adequately large regions remain between the cavities so that the dielectric remains in place for the mechanical stabilization of the interconnects. After this etching of the cavities, the component is covered with a further passivation layer 8, as shown in FIG. 2. As a result, the openings 7 in the first passivation layer 6 are closed without noteworthy deposition in the inside of the cavities. This deposition preferably occurs diffusion-controlled and in a carrier gas that fills the closed cavities later as immersion gas. The manufacturing process for integrated circuits can then be continued with the opening of terminal areas for the external electrical connection (bond wires).

FIG. 2 shows a cross section of a typical embodiment of the inventive semiconductor component manufactured in accordance with the method of the present invention. Here, the cavities 9 extend down onto the semiconductor material, i.e. equal the entire thickness of the region 1 provided for the metallizations. To assure that the semiconductor material is not attacked and damaged when etching the cavities, the cavities 9 are not etched down onto the semiconductor material. Adequately large cavities are obtained, for example, by a correspondingly dense arrangement of the openings 7 provided for the etching. As an additional safeguard, a further passivation layer can be applied directly on the semiconductor material before the application of the metallizations. This passivation layer, for example, can be of the same material as the passivation layers 6,8 on the top side of the region 1 of the metallizations embedded in dielectric. This passivation layer is not attacked during the selective etching of the dielectric, so that the semiconductor material remains protected. The lateral expanse of the cavities and, thus, the maximum length of the uncovered portions of the interconnects must be dimensioned such that the metal webs are adequately mechanically stabilized during operation so that internal mechanical stresses of the layer are absorbed and so that the metal does not stick together in the etching.

The inventive manufacturing of the component is independent of the type of active components and the structure of the contacts and interconnects, so that the disclosed method for reducing the capacitances between the interconnects in semiconductor components can be universally employed. A significant improvement of the functioning of the components is provided with very little additional manufacturing outlay. Use of the method of the present application is also not limited to interconnects and contacts of metal; the inventive reduction of the capacitances can also be applied with interconnects of electrically conductive, doped semiconductor material, e.g. polysilicon. In addition, interconnects can be present in only one metallization level or in various metallization levels. Also, interconnects that belong to different metallization levels can be located in a cavity, and only portions of interconnects of the same metallization level can be located in a cavity.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. Method of manufacturing a semiconductor component having electrically conductive contacts and/or interconnects that are separated from one another in regions by dielectric and are surrounded in regions by cavities that are filled with gas and closed off from the outside, comprising the following steps:

applying the contacts and/or interconnects to a side of the semiconductor component electrically insulated from one another by only one material that is a dielectric;

covering the side of the component having the contacts and/or interconnects with a passivation layer such that the dielectric can be selectively removed;

producing openings in the passivation layer, wherein said openings are large enough and numerous enough for a subsequent etching of the dielectric and small enough for a subsequent deposition of a further passivation layer such that the further passivation layer does not fill the cavities;

etching off the dielectric around the contacts and/or interconnects in regions through the openings, said etching occurring selectively with respect to the contacts and/or interconnects and with respect to the passivation layer to produce the cavities, the etching being limited by a duration of etching; and closing the openings by deposition of a further passivation layer without filling the cavities.

2. Method according to claim 1, wherein the step of closing the openings by deposition of a further passivation layer without filling the cavities further comprises performing the step in a carrier gas that is provided as immersion gas for the cavities.

3. Method according to claim 2, wherein the step of etching off the dielectric further comprises limiting the size of the etched-out cavities such that the maximum length of the interconnects uncovered in the cavities is small enough to avoid sticking.

4. Method according to claim 1, wherein the step of etching off the dielectric further comprises limiting the size of the etched-out cavities such that the maximum length of the interconnects uncovered in the cavities is small enough to avoid sticking.

5. Method according to claim 1, wherein the step of covering the side of the component with a passivation layer further comprises depositing nitride as the passivation layer.

6. Method according to claim 1, wherein the step of closing the openings by deposition of a further passivation layer further comprises depositing nitride as the further passivation layer.

7. Method of manufacturing a semiconductor component having electrically conductive contacts and/or interconnects that are separated from one another in regions by dielectric and are surrounded in regions by cavities that are filled with gas and closed off from the outside, comprising the following steps:

applying the contacts and/or interconnects to a side of the semiconductor component electrically insulated from one another by only one material that is a dielectric;

covering the side of the component having the contacts and/or interconnects with a passivation layer such that the dielectric can be selectively removed;

producing openings in the passivation layer, wherein said openings are large enough and numerous enough for a subsequent etching of the dielectric and small enough for a subsequent deposition of a further passivation layer such that the further passivation layer does not fill the cavities;

etching off the dielectric around the contacts and/or interconnects in regions through the openings, such that a maximum length of the interconnects uncovered in the cavities is small enough to avoid sticking, said etching occurring selectively with respect to the contacts and/or interconnects and with respect to the passivation layer to produce the cavities and the etching being limited by a duration of etching; and closing the openings by deposition of a further passivation layer without filling the cavities in a carrier gas that is provided as immersion gas for the cavities.

* * * * *